United States Patent [19]

Koyanagi et al.

[11] Patent Number: 5,815,045
[45] Date of Patent: Sep. 29, 1998

[54] OSCILLATION APPARATUS

[75] Inventors: Miyuki Koyanagi; Takeo Yasukawa; Koichi Murakami, all of Kawasaki, Japan

[73] Assignee: Fujitsu Limited, Kawasaki, Japan

[21] Appl. No.: 645,752

[22] Filed: May 14, 1996

[30] Foreign Application Priority Data

Aug. 21, 1995 [JP] Japan .................................. 7-211899

[51] Int. Cl.$^6$ ...................................................... H03L 7/08
[52] U.S. Cl. ............................................ 331/143; 331/111
[58] Field of Search ..................................... 331/111, 143

[56] References Cited

U.S. PATENT DOCUMENTS

| | | | |
|---|---|---|---|
| 4,260,959 | 4/1981 | Allgood | 331/111 |
| 4,912,433 | 3/1990 | Motegi et al. | 331/8 |
| 5,420,550 | 5/1995 | May | 331/143 |
| 5,473,641 | 12/1995 | Bauduin | 375/376 |

*Primary Examiner*—Toan Tran
*Assistant Examiner*—An T. Luu
*Attorney, Agent, or Firm*—Staas & Halsey

[57] ABSTRACT

An oscillation apparatus is provided with a present value generating unit for generating a present value which is monotonously increased or decreased with the passage of time; a threshold value generating unit for generating a threshold of which a value is periodically varied; a comparing and detecting unit for comparing the present value generated in said present value generating unit with the threshold generated in said threshold value generating unit; a present value reset unit for resetting the present value to a predetermined initial value whenever said comparing and detecting unit detects a fact that the present value reached the threshold; and a signal generating unit for generating sequentially signals of which a period is defined by a time interval of timing-to-timing in which said comparing and detecting detects a fact that the present value reached the threshold.

8 Claims, 9 Drawing Sheets

OSCILLATION APPARATUS

BACKGROUND OF THE INVENTION

1. Field of the Invention

The present invention relates to an oscillation apparatus, and more particularly to an oscillation apparatus capable of generating signals suitable for the biological rhythm.

2. Description of the Related Art

Hitherto, various types of oscillation apparatuses have been used in extensive fields.

As technology of stabilizing a frequency of an oscillation signal in the conventional oscillation apparatus, there is known, for example, a PLL scheme in which an external synchronizing signal as a reference signal is input, a deviation from the external synchronizing signal is detected, and there is provided such a regulation that when a deviation occurs owing to a perturbation and the like, such a deviation disappears as soon as possible.

By the way, now let us consider, for example, the rhythm of the human life. It will happen that when a person wakes up earlier than usual on a certain morning owing to some causes, the person will begin to feel sleepy earlier than usual on that day, and the earlier sleeping may involve earlier waking the next morning. In this manner, an influence of the perturbation such that the person wakes up earlier than usual on a certain morning will not be restored immediately, but will be recovered little by little to the person's former rhythm over several days.

Also with respect to the rhythm of getting up and going to bed everyday, if a person goes to bed at the same time every evening and gets up uniformly at the same time every morning, then it would be robot-like, but not human-like. It is usual that times of getting up and going to bed are varied everyday.

Recently, there has been developed a system in which an artificial living person is built in a computer and behaves in the computer just as if the artificial living person has human intention and emotion. With regard to such a system, there an effort is made such that the rhythm of the artificial living person approaches that of an actual living person, and not the robot-like one. In order to produce the rhythm of the artificial living person as mentioned above, an oscillation apparatus is used. In such a use, it is preferable to adopt an oscillation apparatus which is operative in such a manner that an influence of the perturbation is not restored immediately, but is recovered little by little devoting a predetermined time, as mentioned above, and in addition, in another situation, even if no perturbation is introduced, the oscillation apparatus oscillates in a frequency which will be varied to a certain degree.

By the way, when it is intended that such an oscillation apparatus is implemented through the prior art, there may be considered, for example, an arrangement in which a variation in a frequency of an oscillation signal due to the perturbation is detected and a frequency of an external periodic signal is varied, and the varied frequency of the external periodic signal is recovered little by little devoting a predetermined time so that the oscillation frequency is recovered devoting the predetermined time, alternatively, an arrangement in which a random signal is generated while oscillation pulses generated from an oscillator are counted, and when the number of the oscillation pulses reaches a value of the random signal, a count-up signal is generated to be adopted as an oscillation signal of which a frequency is varied. However, according to these systems, the oscillator itself tends to oscillates as faithfully as possible, and it is obliged to control, for example, the frequency of the external periodic signal and the number of counts, from the exterior. This involves such a problem that the structure is complicated.

SUMMARY OF THE INVENTION

In view of the foregoing, it is therefore an object of the present invention to provide an oscillation apparatus capable of recovering little by little, for example, an oscillation frequency on a self-control basis in the interior, but not to access from the exterior, with a simple structure, and in addition capable of oscillating in a frequency disturbed in a certain degree.

To attain the above-mentioned object, according to the present invention, there is provided an oscillation apparatus comprising:

(1) a present value generating means for generating a present value which is monotonously increased or decreased with the passage of time;

(2) a threshold value generating means for generating a threshold of which a value is periodically varied;

(3) a comparing and detecting means for comparing the present value generated in said present value generating means with the threshold generated in said threshold value generating means;

(4) a present value reset means for resetting the present value to a predetermined initial value whenever said comparing and detecting means detects a fact that the present value reached the threshold; and (5) a signal generating means for generating sequentially signals of which a period is defined by a time interval of timing-to-timing in which said comparing and detecting means detects a fact that the present value reached the threshold.

Here, it is preferable that said present value generating means generates a present value in which a rate of monotonous increasing or decreasing with the passage of time is optionally controlled.

Further, it is preferable that said threshold value generating means generates a threshold value in which an amplitude of a variable component with the passage of time is optionally controlled. In this case, it is acceptable that the oscillation apparatus further comprises a monitor means for monitoring a frequency variation of the signal generated in said signal generating means, and said threshold value generating means controls the amplitude on the basis of a monitor result by said monitor means.

In the oscillation apparatus as mentioned above, it is acceptable that said present value generating means generates a present value in which a value is varied on a straight line-like configuration basis with a predetermined slope, for example, with the passage of time. Further, it is acceptable that said threshold value generating means generates a threshold value in which a value of a variable component with the passage of time is varied on a sine wave-like configuration basis.

In an oscillation apparatus as mentioned above, said present value generating means generates a present value in which a value is varied on a straight line-like configuration basis with a predetermined slope with the passage of time; said threshold value generating means generates a threshold value in which a value of a variable component with the passage of time is varied on a sine wave-like configuration basis; and when said slope is given with γ, said threshold value is given with 1+K.sin (2 πt), where K is a constant and t is time, and positive integers are given with p and q, respectively, the following equation is satisfied.

$$\gamma/(2\pi) \geq K \geq |1-(p/q)\gamma|$$

This feature makes it possible, when the oscillation frequency is varied, to return slowly to the first or original oscillation frequency.

According to the present invention, there is further provided the second oscillation apparatus comprising:

(2-1) a present value generating means for generating a present value which is monotonously increased or decreased with the passage of time;

(2-2) a threshold value generating means for generating a threshold of which a value is periodically varied;

(2-3) a superposed value generating means for generating a superposed value in which the present value generated in said present value generating means is superposed on the threshold generated in said threshold value generating means;

(2-4) a comparing and detecting means for comparing the superposed value generated in said superposed value generating means with a predetermined threshold;

(2-5) a present value reset means for resetting the present value to a predetermined initial value whenever said comparing and detecting means detects that the superposed value has reached the threshold; and (2-6) a signal generating means for generating sequentially signals of which a period is defined by a time interval of timing-to-timing in which said comparing and detecting means detects that the superposed value has reached the threshold.

As described above, according to the present invention, it is possible to implement an oscillation apparatus having three important functions as set forth below, and in addition being capable of slowly self-controlling a variation of the frequency:

(1) A function of keeping a stable synchronization to the periodic signal applied from the exterior;

(2) A function of easily updating an adaptability to the periodic signal applied from the exterior;

(3) A function of keeping a stability of the oscillation to unexpected perturbation.

Further, according to the present invention, it is possible to gradually recover one's frequency from the perturbation. It is also possible to continue varying one's own oscillation frequency at a frequency near that of the periodic signal applied from the exterior. Since these functions can be implemented by a single system, there is no need to separately prepare additional devices for implementing the respective functions. Thus, it is possible to expect such an advantageous effect that the use of circuits and programs is kept to a minimum amount. Further, it is possible to readily and intuitively update an adaptability to the external oscillation through varying only one parameter (e.g. parameter K in the embodiment). Still further, it is possible to arrange the oscillation apparatus in such a manner that one's oscillation is monitored so that the oscillation characteristic is self-controlled. This arrangement makes it possible to keep the more stable and suitable oscillation.

DESCRIPTION OF THE PREFERRED EMBODIMENTS

Hereinafter, there will be described embodiments of the present invention.

Figure 1:
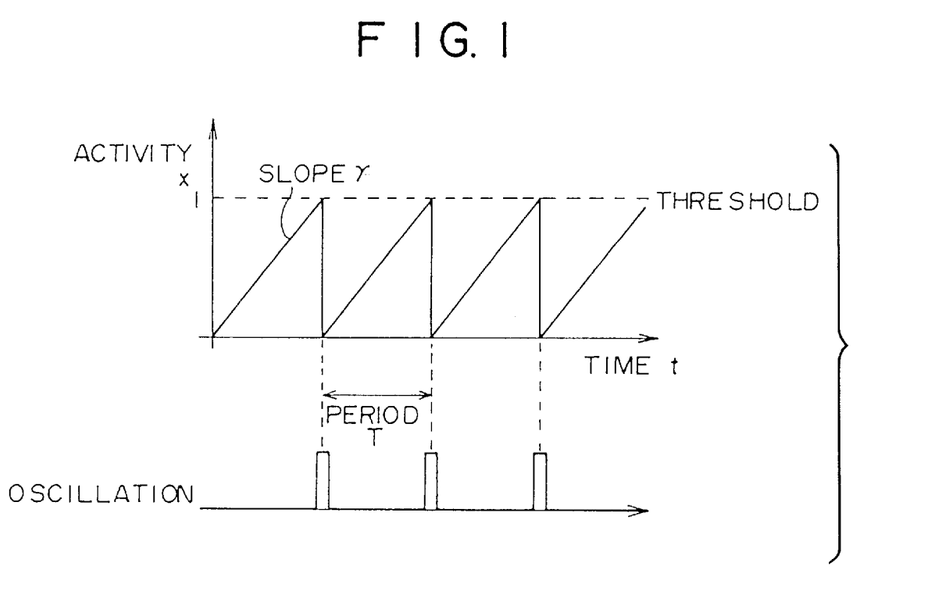
FIG. 1 is an explanatory view of an integrate and fire oscillator.

According to the present embodiments, an oscillation apparatus is of an integrate and fire type. The integrate and fire type of oscillation apparatus may be defined as an oscillation apparatus in which, as shown in FIG. 1, a certain activity for example, a voltage, is accumulated with the passage of time, and when the accumulated activity reaches a threshold, it is fired to generate a pulse. At the time when the firing occurs, the activity returns to zero, and hereafter similarly, the integration and firing process is repeatedly performed to generate a constant frequency pulse sequence. A frequency T of the oscillation apparatus is defined by an integration rate γ (slope-see FIG. 1) of an activity x.

Figure 2:
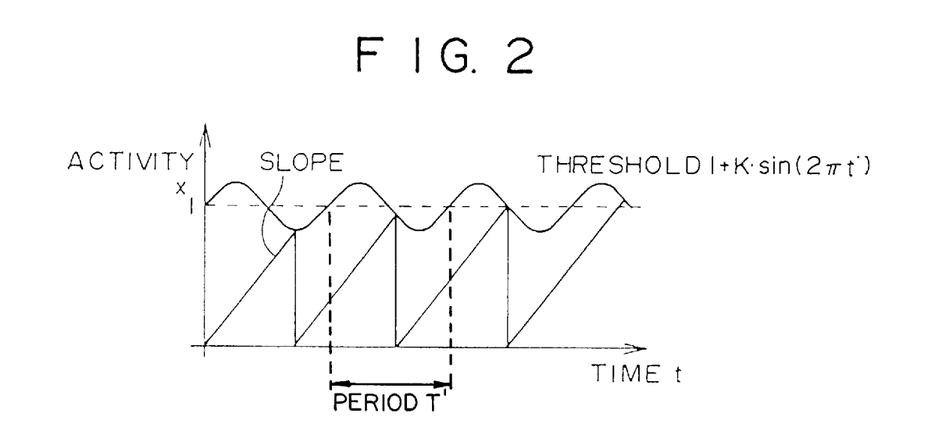
FIG. 2 is an explanatory view showing a state in which a threshold is modulated by a periodic function of a period T'.
Figure 3:
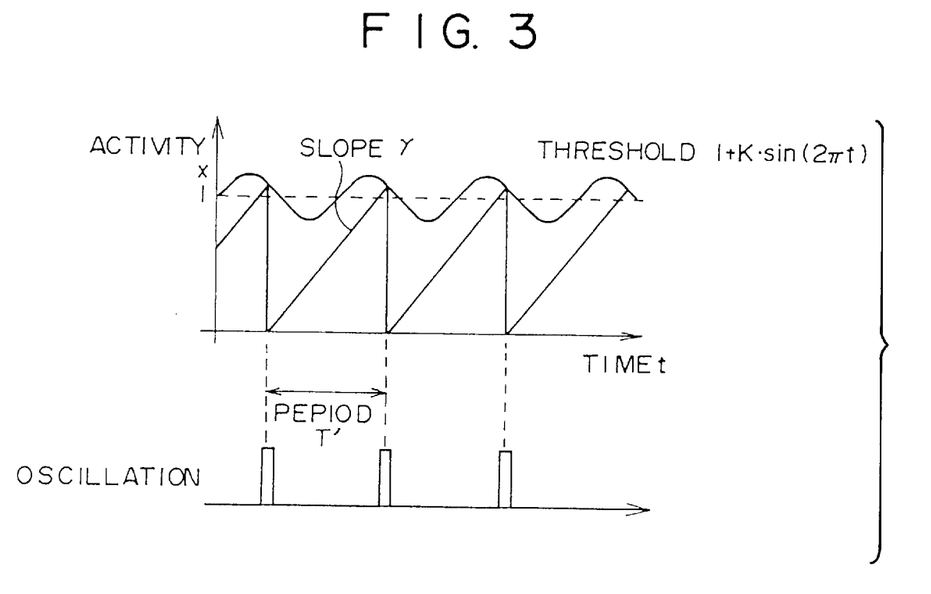
FIG. 3 is an explanatory view showing the situation in which when a threshold is modulated by a periodic function of a period T', a synchronization is gradually attained.

Now, as shown in FIG. 2, it is assumed that the threshold is modulated by the periodic function of period T'=1. An amplitude of the variable component of the modulated threshold is denoted by K. When the well-posed amplitude K is given, while the frequency fluctuates, first, as shown in FIG. 2, after several times of oscillation, the frequency is synchronized with the period T' (the period of the threshold), as shown in FIG. 3. This is done because the periodical modulation of the threshold causes the timing of the firing to approach a certain phase of the periodical modulated threshold. Consequently, when the periodic function to modulate the threshold is inputted in the form of an external periodic signal, the oscillation apparatus may be synchronized with the external periodic signal.

An adaptability to the external oscillation of the oscillation apparatus is defined by the amplitude K of the threshold. The larger the amplitude K, the more the synchronization is feasibly established. The smaller the amplitude K, the more the adaptability goes down, so that the synchronization is not established. Thus, the oscillation apparatus oscillates at a frequency depending on one's own frequency. If it is desired that the oscillation is quickly synchronized with the external oscillation, a large amplitude K may be adopted. If it is desired that the oscillation is slowly synchronized with the external oscillation, a small amplitude K may be adopted. If it is desired that the oscillation is implemented in accordance with one's own frequency while being affected by the external oscillation, the smaller amplitude K may be adopted. If it is desired that the oscillation is implemented independently, the amplitude K=0 may be adopted. As seen from the above, the meaning of the amplitude K is extremely intuitive, and there is no need of special equipment and know-how for control of the adaptability to the external oscillation.

The present embodiments utilize the above-mentioned property to implement an oscillation apparatus having a function to self-control slowly the variation of a frequency.

Figure 4:
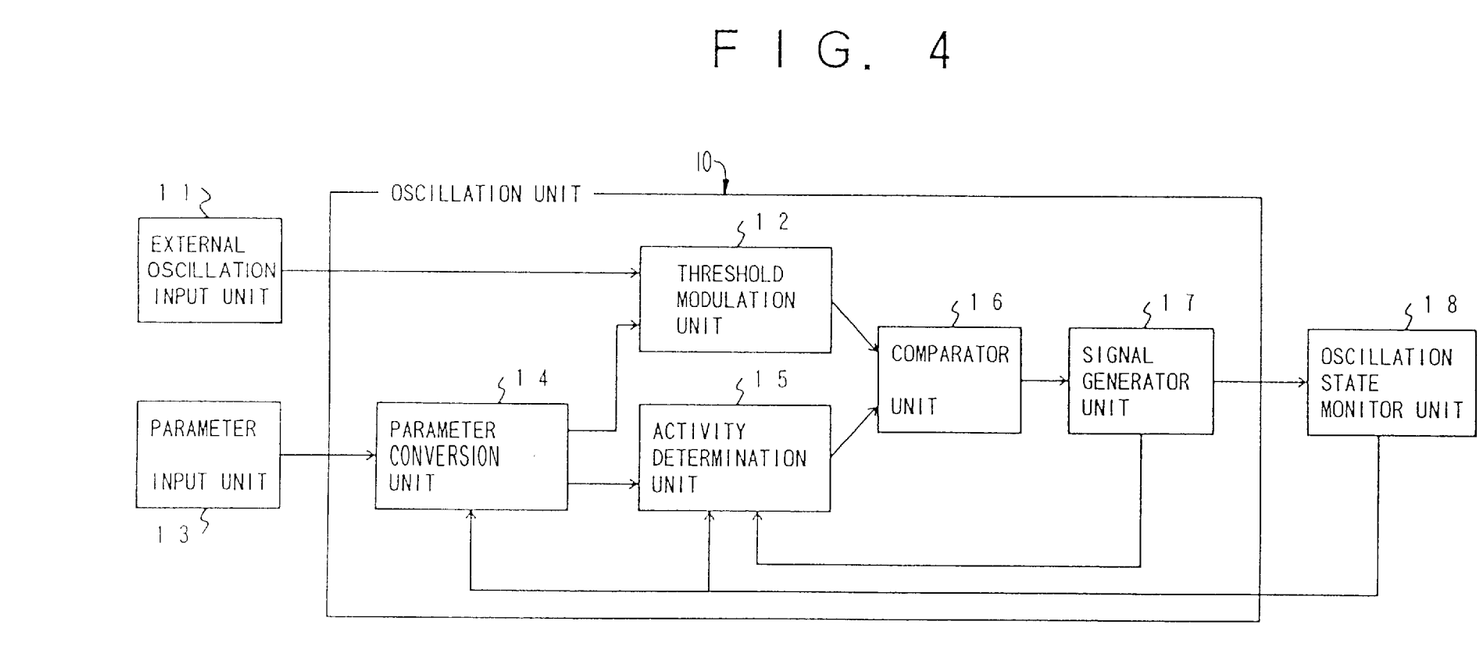
FIG. 4 is a block diagram of an oscillation apparatus according to an embodiment of the present invention.

FIG. 4 is a block diagram of an oscillation apparatus according to an embodiment of the present invention.

An external periodic signal is fed via an external oscillation input unit 11 to an oscillation unit 10. A threshold modulation unit 12 modulates an external periodic signal to achieve threshold value (see FIG. 2), 1×K sin (2 πt). The external periodic signal to be fed to the threshold modulation unit 12 may be supplied in the form of information representative of a frequency and the like. A parameter input unit 13 receives an oscillation frequency of the oscillation apparatus and an input of parameters involved in adaptability to the external oscillation and the like. Upon receipt of an output of the parameter input unit 13, a parameter conversion unit 14 determines parameters, that is, a parameters γ for defining a variable rate of the activity, and a parameter K for defining an amplitude of a variable component of the threshold value. The parameters γ and K are determined through conversion and correction of the output of the parameter input unit 13, to convert the output into a form suitable for internal processing. An activity determination unit 15 determines the present activity see FIGS. 1 and 2 ("present value" referred to in the present invention) of the oscillation apparatus on the basis of the parametery. On the other hand, the threshold modulation unit 12 determines the threshold value after the modulation on the basis of the parameter K and the external periodic signal supplied from the external oscillation input unit 11. A comparator unit 16 investigates as to whether the activity exceeds the present threshold value. If the activity exceeds the present threshold value, then the comparator unit 16 informs of it a signal generator unit 17. Upon receipt of it from the comparator unit 16, the signal generator unit 17 generates a pulse and simultaneously acts on the activity determination unit 15 to reset the activity to zero. As shown in FIG. 4, if there is provided an oscillation state monitor unit 18 for monitoring a pulse signal sequence outputted from the signal generator unit 17, it is possible to change the subsequent oscillation condition through acting on the parameter conversion unit 14 and the activity determination unit 15, if necessary.

Inputted to the oscillation apparatus shown in FIG. 4 is, for example, the sine function of a period 1, sin (2 πt) as the external oscillation. When the external oscillation is not given, the threshold is expressed by 1 (constant) see FIG. 2. The threshold modulated by the external oscillation is expressed by 1+K sin (2 πt). The present activity increases with the rate γ. When the activity reaches the threshold, the firing occurs, and as a result, the activity returns to zero. The parameters defining the characteristic of the oscillation apparatus are two of the above-mentioned rate γ and degree K of an influence to the threshold of the external oscillation.

Figure 5:
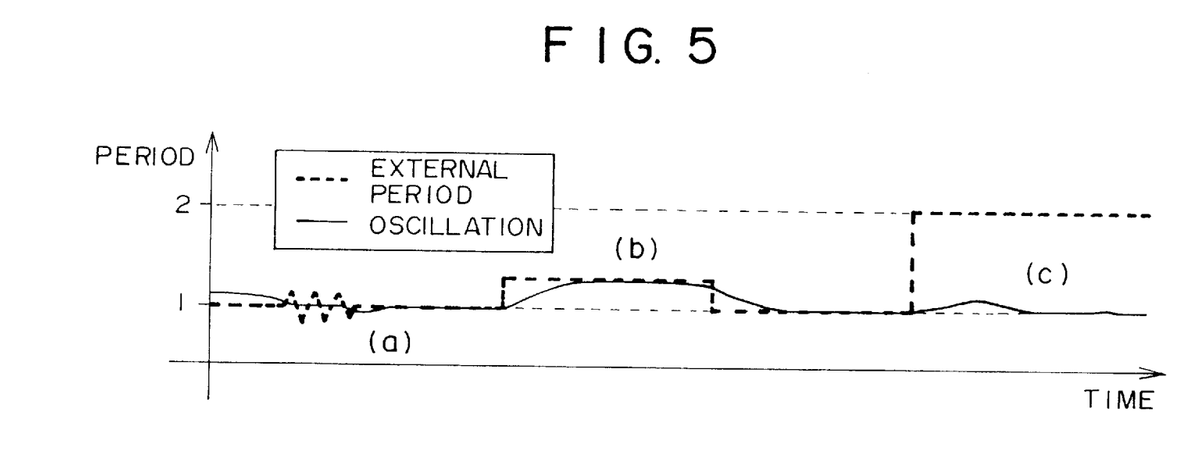
FIG. 5 is a view useful for understanding an oscillation state to a variation of an external oscillation.

An oscillation state of such an oscillation apparatus is shown in FIG. 5. Here, it is assumed that the external periodic signal is of period 1, and the period (defined by γ) of the oscillation apparatus in which the external oscillation is not given is about 1.1. As seen from the beginning portion earlier in time in FIG. 5, the period of the oscillation apparatus starts from a period 1.1, gradually approaches 1, and finally synchronizes with the external oscillation. Further, as seen in the portion (a), even if the external oscillation includes a fine fluctuation, the oscillation apparatus can continue the oscillation almost involving no fluctuation. As seen in the portion (b), if the frequency of the external oscillation is varied, the period of the oscillation apparatus approaches slowly the external oscillation and finally synchronizes with the external oscillation. In a case where a natural frequency of the oscillation apparatus and a frequency of the external oscillation are relatively extremely varied, for example, in a case where the natural frequency of the oscillation apparatus is varied approximately twice as much as the external oscillation, it is possible that the oscillation apparatus is too of the period 2 and completely synchronizes with the external oscillation. On the other hand, as seen in the portion (c), it may happen that the oscillation apparatus is of the period 1 so as to maintain the frequency ratio of 1:2.

Figure 6:
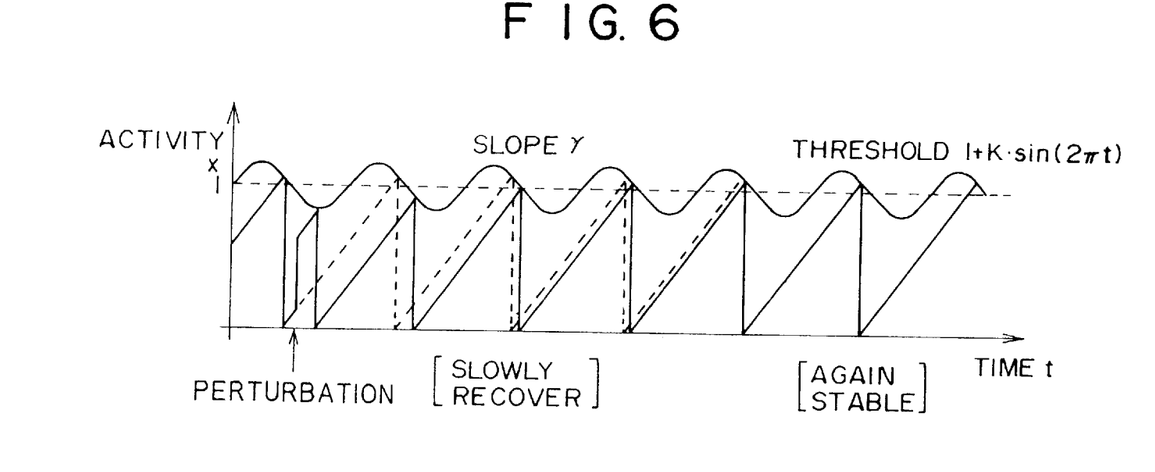
FIG. 6 is an explanatory view useful for understanding the situation in which an activity is rapidly varied by a perturbation.

As shown in FIG. 6, in a case where an activity is rapidly varied by a perturbation, an oscillation frequency converges little by little on a self-control basis on the original stable synchronous state, without a need of such a process that the rapid variation of the activity is monitored and an especial operation is performed. Thus, according to the present embodiment, one's own frequency of the oscillation apparatus is controlled and is recovered without practicing the especial operation for an unexpected perturbation.

Figure 7:
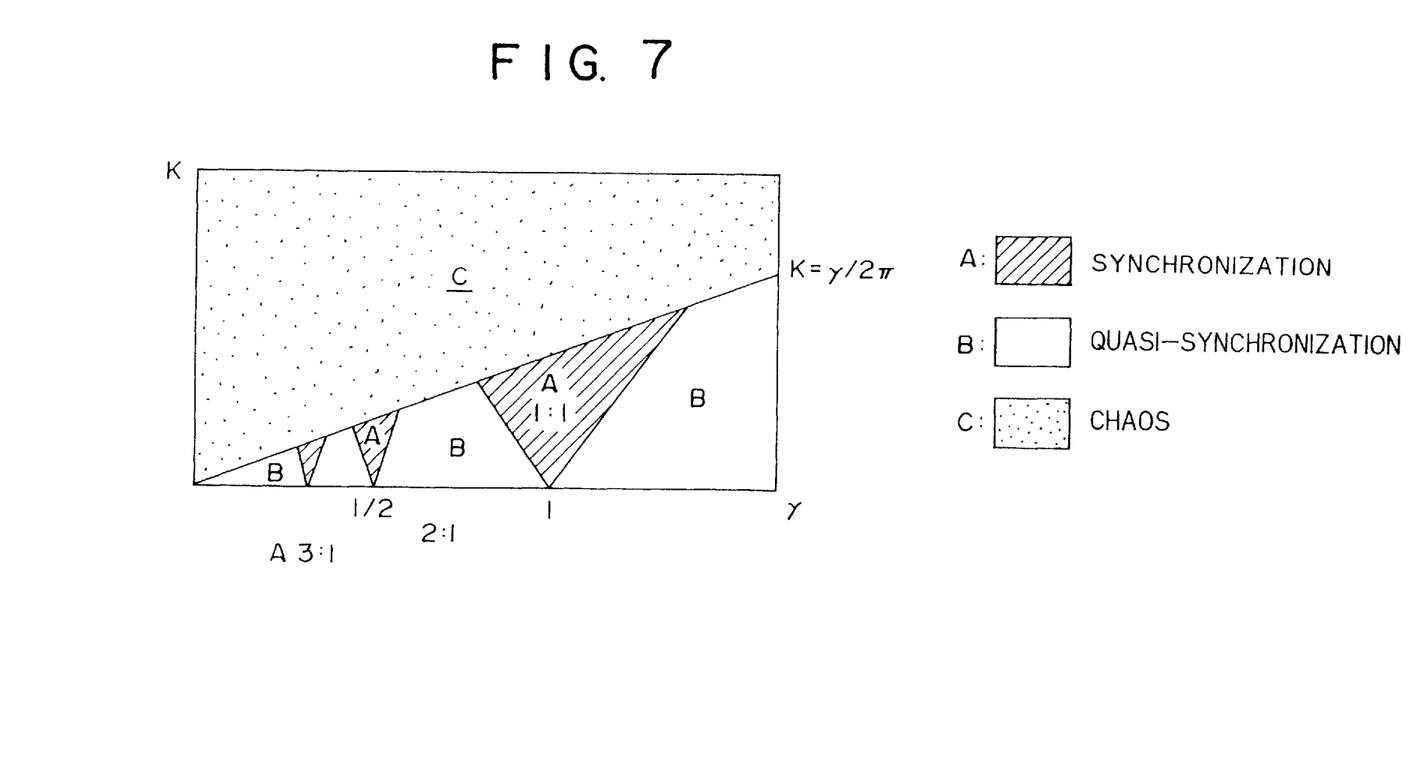
FIG. 7 is a view useful for understanding an oscillation state of the oscillation apparatus according to the embodiment of the present invention in which a coupling power K and γ are given.

FIG. 7 is a view useful for understanding an oscillation state of the oscillation apparatus according to the embodiment of the present invention in which a coupling power K and a slope γ are given in the form of parameters.

In FIG. 7, areas A, B and C denote a synchronization area in which a synchronization with the external oscillation is established, a quasi-synchronization area in which a synchronization with the external oscillation is almost established, and a Chaos area in which a synchronization with the external oscillation is not established, respectively.

When a period T of the oscillation apparatus is given with 1/γ, that is, T=1/γ, where the coupling power K=0, the condition of the coupling power K for establishing a synchronization of the oscillation apparatus with the external oscillation T' at a ratio of p:q (p and q are positive integers), that is, the synchronization area A in FIG. 7 is expressed by $$\gamma/(2\ \pi) \geq K \geq |1-(p/q)\gamma|$$

Incidentally, while FIG. 7 shows only three area as the synchronization area A, the synchronization area A appears actually in the vicinity of all rational numbers.

As the states in which the oscillation apparatus is not synchronized with the external oscillation, there are two states of which the first is a quasi-synchronization state (the quasi-synchronization area B), and the second is a Chaos state (the Chaos area C), as shown in FIG. 7. When the synchronization is not established, the output of the oscillation apparatus is not stabilized at a constant frequency, and has a fluctuation as will be set forth below.

Figure 8:
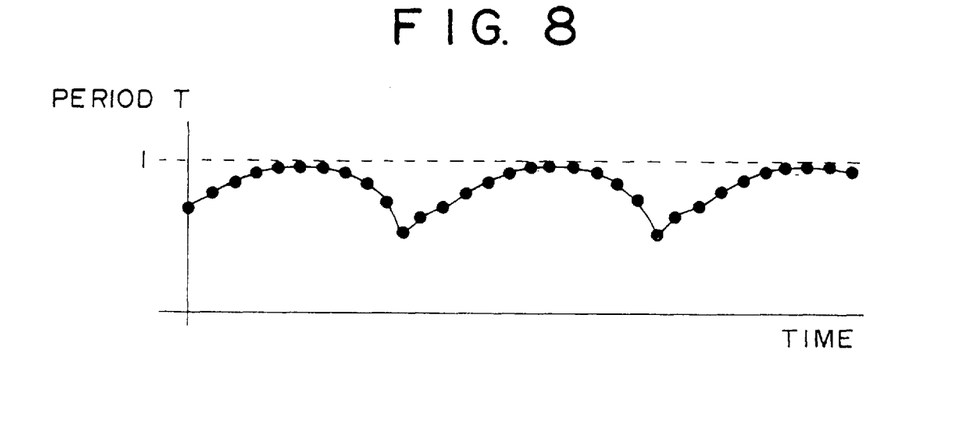
FIG. 8 is a view which exemplarily shows a variation of the period of an output of the oscillation apparatus in a quasi-synchronization state.

FIG. 8 is a view which exemplarily shows a variation of the period of an output of the oscillation apparatus in a quasi-synchronization state.

In the quasi-synchronization state, the output of the oscillation apparatus is given with the approximately constant period, and the repetitive pattern or the similar pattern in the variation of the period is found.

Figure 9:
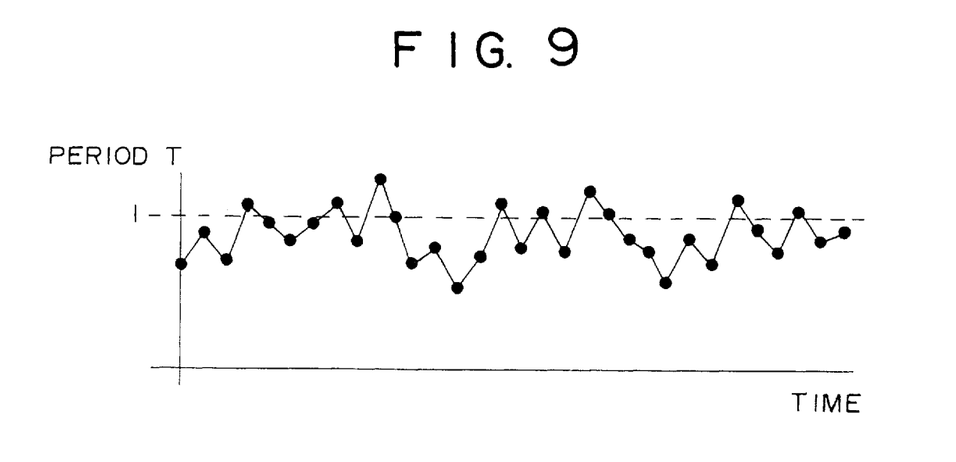
FIG. 9 is a view which exemplarily shows a variation of the period of an output of the oscillation apparatus in a Chaos state.

FIG. 9 is a view which exemplarily shows a variation of the period of the output of the oscillation apparatus in a Chaos state.

While the fluctuation of the period is kept within a certain width, the state of the variation is apparently random and the periodicity cannot be found.

Thus, according to the oscillation apparatus of the present embodiment, it is possible to obtain the various output in accordance with the parameters K and γ, and also possible to adapt it to various uses, such as a case in which it is desired that the oscillation apparatus is slowly synchronized with the external oscillation, and a case in which the oscillation frequency is varied at random with a period near the external oscillation.

Figure 10:
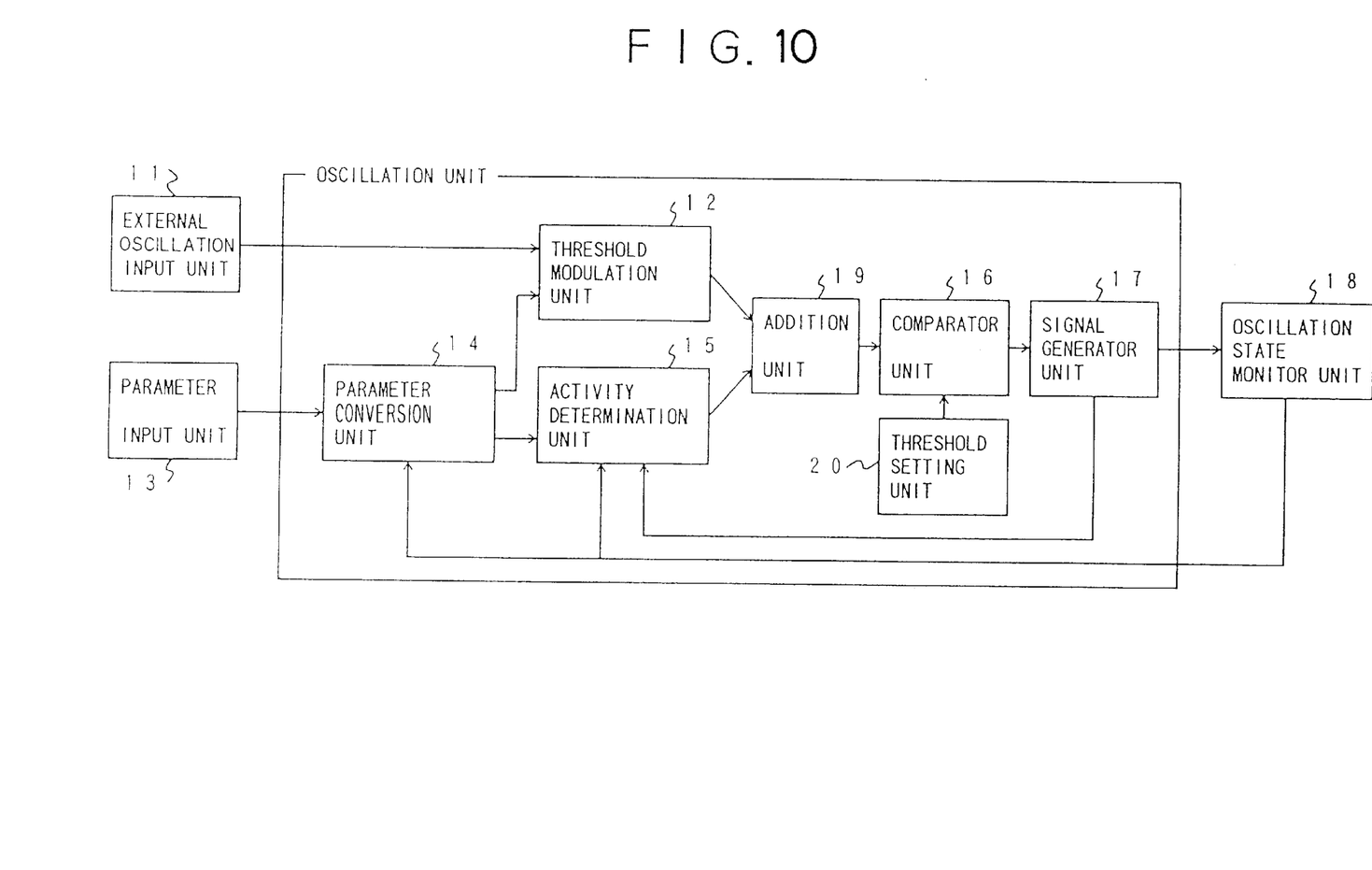
FIG. 10 is a block diagram of an oscillation apparatus according to another embodiment of the present invention.

FIG. 10 is a block diagram of an oscillation apparatus according to another embodiment of the present invention. In FIG. 10, the same parts are denoted by the same reference numbers as those of FIG. 4, and the redundant explanation will be omitted.

According to the embodiment shown in FIG. 10, the threshold value after modulation, which is determined by the threshold modulation unit 12, and the activity determined by the activity determination unit 15, are fed to an adder unit 19 so as to evaluate the subtraction value (an example of the superposition value referred to in the present invention) derived through the subtraction of the threshold value from the activity. Incidentally, according to the present embodiment, the threshold value after modulation, which is determined by the threshold modulation unit 12, is an example of the periodic value referred to in the present invention.

The subtraction value evaluated in the adder unit 19 is fed to the comparator unit 16. The comparator unit 16 receives also a threshold value produced by a threshold value setting unit 20, which threshold value is constant on a time basis. Thus, the comparator unit 16 compares the subtraction value with the threshold value which is constant on a time basis.

Since the comparator unit 16 serves to compare two values with each other, it is acceptable to provide an arrangement in which as shown in FIG. 4, the threshold value is modulated and the threshold value thus modulated is fed to the comparator unit 16, alternatively, an arrangement in which as shown in FIG. 10, the modulated threshold value (the periodic value referred to in the present invention) is superposed on the activity through arithmetic operation such as the subtraction, the addition or the like, the superposed value and the threshold value which is constant on a time basis are fed to the comparator unit 16. In any cases, it is possible to obtain substantially the same comparison result.

Figure 11:
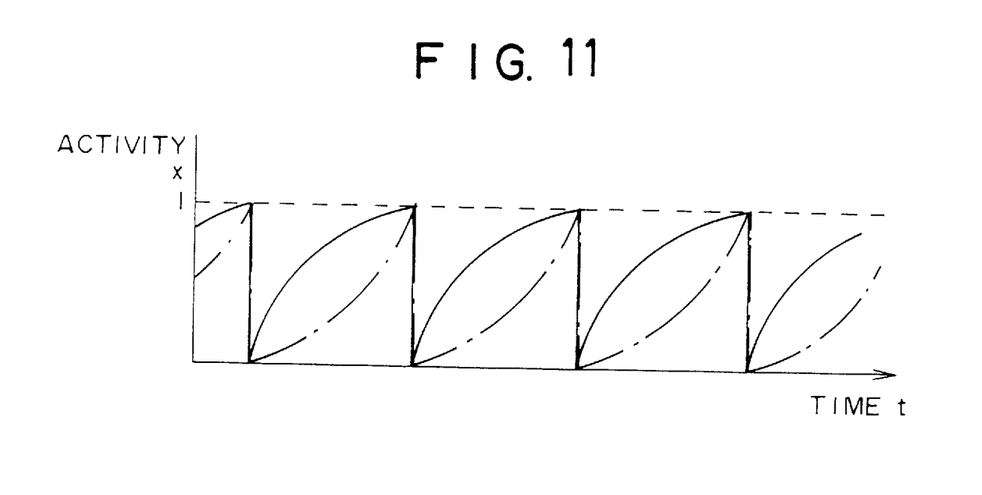
FIG. 11 is a view showing a variation of the present value.

While the present embodiment exemplarily shows an oscillation apparatus in which the activity is varied on a straight line-like configuration basis with the passage of time, the present value referred to in the present invention is not limited to the one which is varied on a straight line-like configuration basis, it is acceptable that the activity is varied on a curve-like configuration basis with the passage of time, as shown in FIG. 11 with a solid line or a dashed line.

Figure 12:
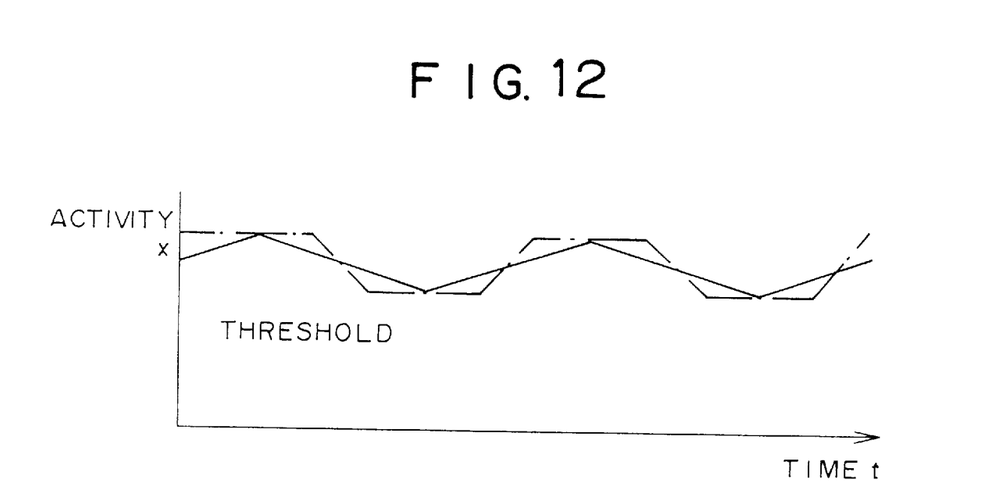
FIG. 12 is a view showing a variation of the threshold in which the variable component thereof is varied in a triangle wave-like shape or a trapezium wave-like shape.

Further, while the present embodiment exemplarily shows an oscillation apparatus in which as the modulated threshold value there is dealt with a threshold value of which a variable component is varied on a sine wave-like configuration basis, the threshold value and the periodic value in which values are periodically varied are not limited to the one which is varied on a sine wave-like configuration basis, it is acceptable that the threshold is varied on a triangle wave-like shape basis or a trapezium wave-like shape basis with the passage of time, as shown in FIG. 12 with a solid line or a dashed line.

Still further, while the present embodiment exemplarily shows an oscillation apparatus in which the activity is monotonously increased, and in addition the threshold value, which is larger than the activity, is set up, it is acceptable that a threshold value, which is smaller than the activity, is set up, and the activity is monotonously decressed.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

We claim:

1. An oscillation apparatus comprising:

present value generating means for generating a present value which is continuously increased or decreased from an initial value with the passage of time;

threshold value generating means for generating a threshold having a value which is periodically varied independently varied to the present value;

comparing and detecting means for comparing the present value generated in said present value generating means with the threshold generated in said threshold value generating means and detecting when the present value has reached the threshold;

present value reset means for resetting the present value to the initial value whenever said comparing and detecting means detects that the present value has reached the threshold; and signal generating means for sequentially generating signals having a period defined by a time interval between occurrences of said comparing and detecting means detecting that the present value has reached the threshold.

2. An oscillation apparatus according to claim 1, wherein said present value generating means generates a present value in which a rate of monotonous increasing or decreasing with the passage of time is optionally controlled.

3. An oscillation apparatus according to claim 1, wherein said threshold value generating means generates a threshold value in which an amplitude of a variable component with the passage of time is optionally controlled.

4. An oscillation apparatus according to claim 3, further comprising a monitor means for monitoring a frequency variation of the signal generated in said signal generating means, wherein said threshold value generating means controls the amplitude on the basis of a monitor result by said monitor means.

5. An oscillation apparatus according to claim 1, wherein said present value generating means generates a present value in which a value is varied on a straight line-like configuration basis with a predetermined slope with the passage of time.

6. An oscillation apparatus according to claim 1, wherein said threshold value generating means generates a threshold value in which a value of a variable component with the passage of time is varied on a sine wave-like configuration basis.

7. An oscillation apparatus according to claim 1, wherein said present value generating means generates a present value in which a value is varied on a straight line-like configuration basis with a predetermined slope with the passage of time; said threshold value generating means generates a threshold value in which a value of a variable component with the passage of time is varied on a sine wave-like configuration basis; and when said slope is given with γ, said threshold value is given with 1+K.sin (2 πt), where K is a constant and t is time, and positive integers are given with p and q, respectively, the following equation is satisfied.

$$\gamma/(2\pi) \geq K \geq |1-(p/q)\gamma|$$

8. An oscillation apparatus comprising:

present value generating means for generating a present value which is continuously increased or decreased from an initial value with the passage of time;

threshold value generating means for generating a threshold having a value which is periodically varied independently varied to the present value;

means for generating a superposed value in which the present value generated in said present value generating means is superposed on the threshold generated in said threshold value generating means;

comparing and detecting means for comparing the present value generated in said present value generating means with the threshold generated in said threshold value generating means and detecting when the present value has reached the threshold;

present value reset means for resetting the present value to the initial value whenever said comparing and detecting means detects that the present value has reached the threshold; and signal generating means for sequentially generating signals having a period defined by a time interval between occurrences of said comparing and detecting means detecting that the present value has reached the threshold.

* * * * *